United States Patent [19]
Mittel et al.

[11] Patent Number: 5,789,987
[45] Date of Patent: Aug. 4, 1998

[54] LOW-NOISE FREQUENCY SYNTHESIZER

[75] Inventors: James Gregory Mittel; Scott Humphreys, both of Boynton Beach, Fla.

[73] Assignee: Motorola, Inc., Schaumburg, Ill.

[21] Appl. No.: 589,362

[22] Filed: Jan. 22, 1996

[51] Int. Cl.$^6$ .................................. H03L 7/06; H03C 1/06
[52] U.S. Cl. .................................. 331/17; 331/2; 331/11; 331/23; 375/376; 329/318; 329/325
[58] Field of Search ........................ 331/17, 2, 11, 331/23; 375/376; 332/127; 329/318, 325

[56] References Cited

U.S. PATENT DOCUMENTS

| | | | |
|---|---|---|---|
| 4,167,711 | 9/1979 | Smoot | 331/17 |
| 4,528,522 | 7/1985 | Matsuura | 331/2 |
| 4,691,176 | 9/1987 | Hsiung et al. | 331/2 |
| 5,270,669 | 12/1993 | Jokura | 331/2 |
| 5,281,930 | 1/1994 | Taromaru et al. | 332/127 |

OTHER PUBLICATIONS

Motorola, Inc., "Suppress phase–lock–loop sidebands without introducing instability," pp. 10–53 1991 AR254 #3.
Motorola, Inc., "MECL Integrated Circuits," pp. 7–79, 1983 Series D.
J. Hoyle and E. Sanchez–Sinencio, "Sinusoidal Quadrature OTA Oscillators," p. 60, Texas A&M Univeristy, Aug. 1984,Texas.
Randall L. Geiger and Edgar Sanchez–Sinencio, "Active Filter Design Using Operational Transconductance Amplifier: A Tutorial," p. 28, 1985, IEEE Circuits and Devices Magazine.

*Primary Examiner*—Robert Pascal
*Assistant Examiner*—An T. Luu

[57] ABSTRACT

A frequency synthesizer (100) is utilized for producing an output signal (124) which is phase locked to a reference signal (110) operating at a reference frequency. The frequency synthesizer (100) comprises a main phase lock loop (PLL) (102), and a tracker PLL (128). The main PLL (102) includes a phase detector (112), two frequency dividers (108, 126), a loop filter (116), a notch filter (118), and a controlled oscillator (122). The tracker PLL (128) phase locks to the reference signal (110), and biases the notch filter (118) in order to maintain an accurate lock on the notch frequency which is proportional to the reference frequency. All circuits are integrated in the same monolithic device in order to track parametric tolerances such as transconductances of the operational transconductance devices included in the tracker PLL (128) and the notch filter (118).

14 Claims, 2 Drawing Sheets

LOW-NOISE FREQUENCY SYNTHESIZER

FIELD OF THE INVENTION

This invention relates in general to phase lock loops, and more specifically to a low-noise frequency synthesizer.

BACKGROUND OF THE INVENTION

Conventional frequency synthesizers typically employ a phase detector such as a sink-source-float phase detector. At low frequencies, the sink-source-float phase detector generates large current spikes that are injected into the loop filter at the reference frequency rate. If the spikes are not sufficiently attenuated by the loop filter, then energy at harmonics of the loop reference signal will modulate the voltage controlled oscillator thereby creating noise jitter.

In a communication receiver utilizing a conventional frequency synthesizer, noise modulation such as described will adversely degrade the radio selectivity of the communication receiver. When the loop filter is designed to sufficiently attenuate these spikes, the low cutoff frequency required for removing the reference signal noise would decrease the system time response. For this reason, redesign of the loop filter is not an adequate solution.

Thus, what is needed is an apparatus that substantially reduces low frequency noise inherent in the sink-source-float based PLL that is injected into the voltage controlled oscillator. The method for reducing the low frequency noise must not adversely affect the response time of the frequency synthesizer to changes in frequency.

SUMMARY OF THE INVENTION

An aspect of the present invention is a frequency synthesizer for producing an output signal which is phase locked to a reference signal operating at a reference frequency. The frequency synthesizer comprises a main phase lock loop, including a controlled oscillator for generating the output signal operating at an output frequency determined by a filtered control signal, and a first frequency divider coupled to the controlled oscillator for frequency dividing the output signal to produce a comparison signal operating at the reference frequency. The frequency synthesizer further includes a main phase error detector coupled to the first frequency divider and coupled to the reference signal for generating a control signal, and a main notch filter having a notch frequency and coupled to the main phase error detector for selectively removing from the control signal a spurious noise signal occurring at the reference frequency, to derive the filtered control signal. The frequency synthesizer also includes a tracker phase lock loop comprising a tracker oscillator including a tracker filter coupled to a tracker adjustment signal for generating a tracker signal operating at a tracker frequency determined in part by the tracker adjustment signal, and a tracker phase error detector coupled to the reference signal and coupled to the tracker oscillator for generating the tracker adjustment signal for adjusting the tracker oscillator to phase lock the tracker signal to the reference signal.

A second aspect of the present invention is a communication receiver. The communication receiver comprises an antenna for intercepting a radio signal including a message, a receiver element coupled to the antenna for demodulating the message, a processor coupled to the receiver element for processing the message, a user control coupled to the processor for providing control of the communication receiver by a user, and a display coupled to the processor for displaying the message. The receiver element includes a reference oscillator for generating a reference signal operating at a reference frequency, and a frequency synthesizer coupled to the reference oscillator for producing an output signal which is phase locked to the reference signal. The frequency synthesizer comprises a main phase lock loop, including a controlled oscillator for generating the output signal operating at an output frequency determined by a filtered control signal, a first frequency divider coupled to the controlled oscillator for frequency dividing the output signal to produce a comparison signal operating at the reference frequency, a main phase error detector coupled to the first frequency divider and coupled to the reference signal for generating a control signal, and a main notch filter having a notch frequency and coupled to the main phase error detector for selectively removing from the control signal a spurious noise signal occurring at the reference frequency, to derive the filtered control signal. The frequency synthesizer further comprises a tracker phase lock loop including a tracker oscillator comprising a tracker filter coupled to a tracker adjustment signal for generating a tracker signal operating at a tracker frequency determined in part by the tracker adjustment signal, and a tracker phase error detector coupled to the reference signal and coupled to the tracker oscillator for generating the tracker adjustment signal for adjusting the tracker oscillator to phase lock the tracker signal to the reference signal.

A third aspect of the present invention is a frequency synthesizer for producing an output signal which is phase locked to a reference signal operating at a reference frequency. The frequency synthesizer comprises a main phase lock loop, including a controlled oscillator for generating the output signal operating at an output frequency determined by a filtered control signal, a first frequency divider coupled to the controlled oscillator for frequency dividing the output signal to produce a comparison signal operating at the reference frequency, a main phase error detector coupled to the first frequency divider and coupled to the reference signal for generating a control signal, and a main filter coupled to the main phase error detector for filtering the main phase lock loop to derive the filtered control signal. The frequency synthesizer further comprises a tracker phase lock loop, including a tracker oscillator comprising a tracker filter coupled to a tracker adjustment signal for generating a tracker signal operating at a tracker frequency determined in part by the tracker adjustment signal, and a tracker phase error detector coupled to the reference signal and coupled to the tracker oscillator for generating the tracker adjustment signal for adjusting the tracker oscillator to phase lock the tracker signal to the reference signal. The main filter is similar to the tracker filter but selected characteristic frequencies of the main filter are scaled in proportion to the reference frequency in response to the tracker adjustment signal when the tracker signal is phase locked to the reference signal. The main filter and the tracker filter comprise an operational transconductance amplifier (OTA) having a transconductance controlled by the tracker adjustment signal, and wherein the main filter and the tracker filter each have a cutoff frequency proportional to the transconductance.

DESCRIPTION OF THE PREFERRED EMBODIMENT

Figure 1:
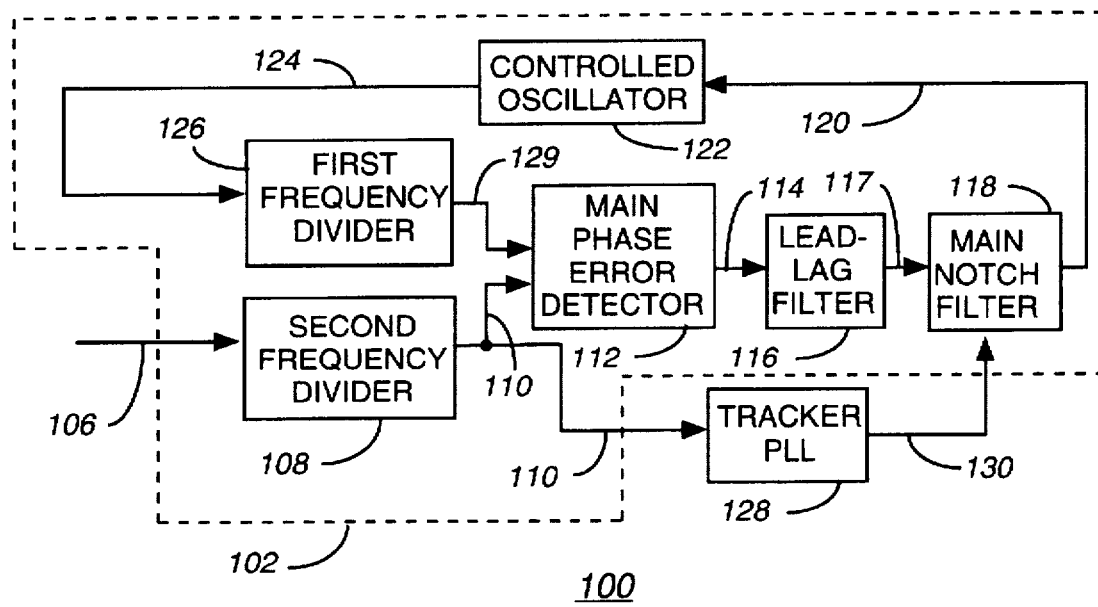
FIG. 1 is an electrical block diagram of a frequency synthesizer in accordance with the preferred embodiment of the present invention.

FIG. 1 is an electrical block diagram of a frequency synthesizer 100 in accordance with the preferred embodiment of the present invention. The frequency synthesizer 100 is used for producing an output signal 124 which is phase locked to a reference signal 110 operating at a reference frequency. The frequency synthesizer 100 comprises a tracker phase lock loop (PLL) 128, and a main phase lock loop (PLL) 102. The main PLL 102 includes a controlled oscillator 122, a first frequency divider 126, a second frequency divider 108, a main phase error detector 112, a lead-lag filter 116, and a main notch filter 118.

The controlled oscillator 122 is a conventional voltage controlled oscillator used for generating the output signal 124 operating at an output frequency determined by a filtered control signal 120. The first frequency divider 126 comprises a conventional first programmable frequency divider similar to an MC12014 "Feedback Counter with Dual Modulus Prescaler," manufactured by Motorola, Inc. A detailed description of the MC12014 can be found in a technical publication by Motorola, "MECL Integrated Circuits," p. 7–79, 1983 Series D.

The first frequency divider 126 is coupled to the controlled oscillator 122 for frequency dividing the output signal 124 to produce a comparison signal 129 operating at the reference frequency. The reference signal 110 is generated by the second frequency divider 108, which utilizes a conventional second programmable frequency divider similar in design to the MC12014 that is coupled to a clock signal 106 for frequency dividing the clock signal 106 to produce the reference signal 110 operating at the reference frequency.

The main phase error detector 112 includes a conventional phase detector such as a sink-source-float phase error detector, which is coupled to the first frequency divider 126 and coupled to the reference signal 110 for generating a control signal 114. The control signal 114 is then conditioned by the lead-lag filter 116, which employs a conventional lead-lag filter network to produce a conditioned control signal 117. The main notch filter 118 includes a notch filter that is coupled to the main phase error detector 112 for selectively removing from the conditioned control signal 117 a spurious noise signal occurring at the reference frequency, to derive the filtered control signal 120. In the alternative embodiment, the tracker PLL 128 is coupled to the reference signal 110 for generating a tracker adjustment signal 130 coupled to the main notch filter 118 for controlling the notch frequency of the main notch filter 118.

It will be appreciated that, alternatively, the tracker PLL 128 can be coupled indirectly to the reference signal 110. For example, an additional frequency divider can be inserted between the reference signal 110 and the tracker PLL 128 for operating the tracker PLL 128 at a lower frequency than the reference signal 110, or the additional divider can be coupled to the clock signal 106 for providing even greater flexibility of the tracker frequency. Alternatives such as these can be utilized to adjust the notch frequency of the main notch filter 118 as desired for best performance.

Figure 2:
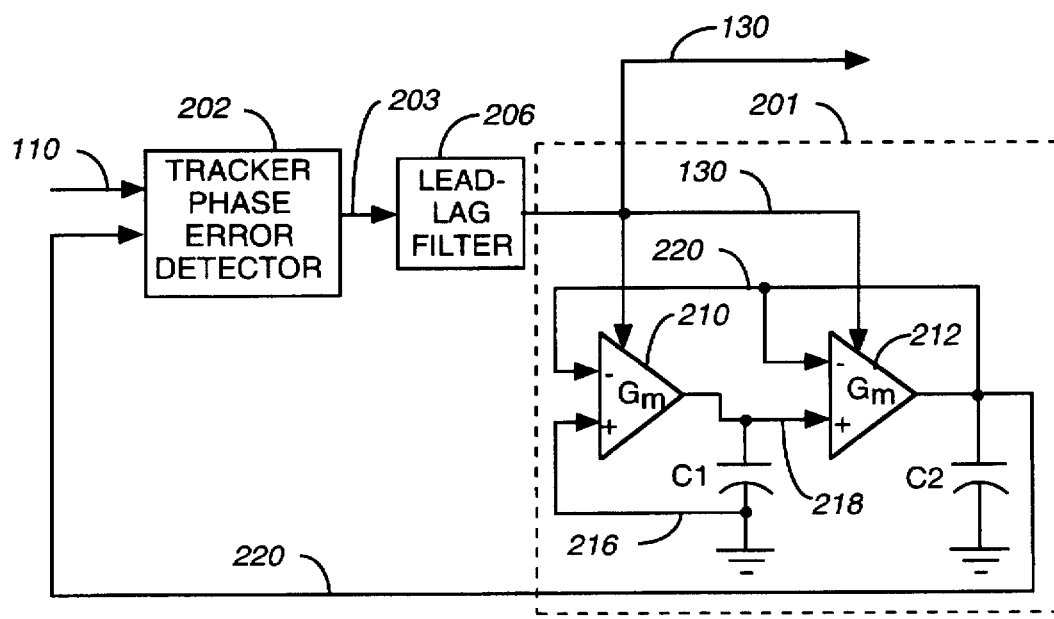
FIG. 2 is an electrical block diagram of a tracking phase lock loop in accordance with the preferred embodiment of the present invention.

FIG. 2 is an electrical block diagram of the tracker PLL 128 in accordance with the preferred embodiment of the present invention. The tracker PLL 128 includes a tracker phase error detector 202, a lead-lag filter 206, and a tracker oscillator 201. The tracker oscillator 201 is coupled to a tracker adjustment signal 130 for generating a tracker signal 220 operating at a tracker frequency determined in part by the tracker adjustment signal 130. The tracker phase error detector 202 is coupled to the reference signal 110 and coupled to the tracker oscillator 201 for generating a phase error signal 203 coupled to the lead-lag filter 206, which employs a conventional lead-lag filter network for producing the tracker adjustment signal 130. The tracker adjustment signal 130 is used for adjusting the tracker oscillator 201 to phase lock the tracker signal 220 to the reference signal 110.

The tracker oscillator 201 comprises a tracker filter, which includes two conventional operational transconductance amplifiers (OTA) 210, 212, and two conventional capacitors C1 and C2. The tracker oscillator 201 is configured as a conventional sinusoidal quadrature OTA oscillator. The negative inputs of OTAs 210, 212 are coupled to the tracker signal 220 generated by the output of OTA 212, and coupled to C2, which is referenced to signal ground. The positive input of OTA 210 is coupled to signal ground 216. The output signal 218 of OTA 210 is coupled to the positive input of OTA 212 and coupled to C1, which is referenced to signal ground. The tracker adjustment signal 130 is used for controlling the transconductances of OTAs 210, 212. The tracker oscillator 201 oscillates at a natural frequency determined by the expression $$\omega 1_o = \frac{G_m}{\sqrt{C_1 C_2}}.$$

A detailed description of the sinusoidal quadrature OTA oscillator can be found in a publication by J. Hoyle and E. Sanchez-Sinencio, "Sinusoidal Quadrature OTA Oscillators," p. 60, Texas A&M University, August, 1984. It will be appreciated that, alternatively, other configurations can be used for the tracker filter such as transconductance-C elliptic low pass filters.

Figure 3:
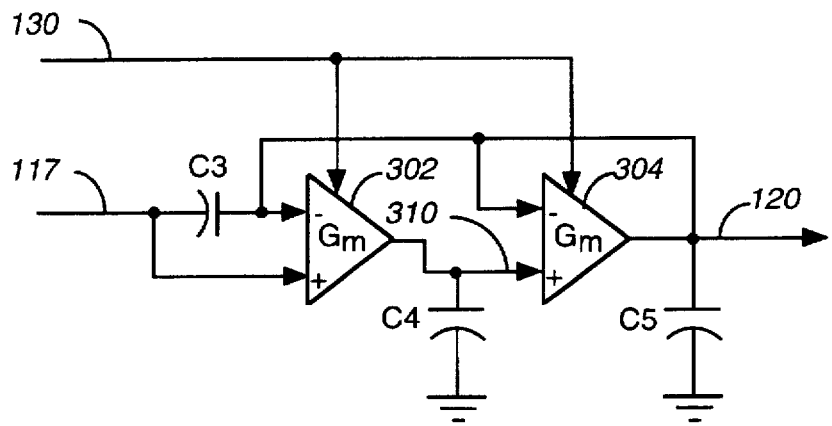
FIG. 3 is an electrical block diagram of the main notch filter in accordance with the preferred embodiment of the present invention.

FIG. 3 is an electrical block diagram of the main notch filter 118 in accordance with the preferred embodiment of the present invention. The main notch filter 118 preferably also is coupled to the tracker adjustment signal 130. The main notch filter 118 is similar to the tracker filter but scaled such that the notch frequency of the main notch filter 118 falls near the reference frequency in response to the tracker adjustment signal 130 when the tracker signal 220 is phase locked to the reference signal 110. The main notch filter 118 preferably operates as a transconductance-C elliptic low pass filter.

The main notch filter 118 includes two conventional operational transconductance amplifiers (OTA) 302, 304, and three conventional capacitors C3, C4, and C5. C3 is coupled to the conditioned control signal 117 and coupled to the negative terminal of OTA 302. The negative terminal of OTA 302 is also coupled to the filtered control signal 120 generated by the output of OTA 304, which is coupled to C5 referenced to signal ground. The positive terminal of OTA 302 is coupled to the conditioned control signal 117. The output signal 310 of OTA 302 is coupled to C4 referenced to signal ground, and coupled to the positive terminal of OTA 304. The negative terminal of OTA 304 is coupled to the filtered control signal 120. Similar to the tracking filter, the tracker adjustment signal 130 is used for controlling the transconductances of OTAs 302, 304. The main notch filter 118 has a cutoff frequency determined by the expression $$w2_0 = \frac{G_m}{\sqrt{C_4(C_3+C_5)}}.$$

The notch frequency of the main notch filter 118 is determined by the expression $$\omega 2_z = \frac{G_m}{\sqrt{C_3 C_4}}$$

A detailed description of the notch filter can be found in a publication by Randall L. Geiger and Edgar Sanchez-Sinencio, "Active Filter Design Using Operational Transconductance Amplifier: A Tutorial," p. 28, 1985, IEEE Circuits and Devices Magazine.

Thus, the main filter 118 and the tracker filter of the tracker PLL 128 are comprised of OTAs having a transconductance controlled by the tracker adjustment signal 130. The main filter 118 and the tracker filter each have a cutoff frequency proportional to the transconductance of the OTAs utilized therein.

In an alternative embodiment, the main notch filter 118 can be replaced with a main filter employing a different filter configuration such as, for example, a conventional symmetrical notch filter. The main filter is similar to the tracker filter but selected characteristic frequencies of the main filter are scaled in proportion to the reference frequency in response to the tracker adjustment signal 130 when the tracker signal 220 is phase locked to the reference signal 110.

For proper operation of the main PLL 102, the tracker PLL 128 and the main notch filter 118 preferably are integrated in the same monolithic integrated circuit in order to take advantage of the tracking characteristics of the transconductances of the OTAs 210, 212, 302, 304 and the capacitance of the capacitors C1–C5. By integrating the OTAs 210, 212, 302, 304 and the capacitors C1–C5 in the same device, the transconductance values and capacitor values of each device are substantially the same value. Thus, the control of each device by way of the tracker adjustment signal 130 leads to a predictable result substantially following the equations $\omega 1_o$ and $\omega 2_o$, independent of fabrication variations and/or temperature variations during operation.

The combination of the tracker PLL 128 and the main notch filter 118 substantially eliminates the spurious frequency of the reference signal 110. Without these elements large current spikes at low frequencies, e.g., 5 KHz, would be injected into the controlled oscillator 122, thereby modulating unwanted noise into the output signal 124 generated by the controlled oscillator 122. By substantially reducing the noise injected from the reference signal 110, the noise performance of the main PLL 102 is significantly improved.

Figure 4:
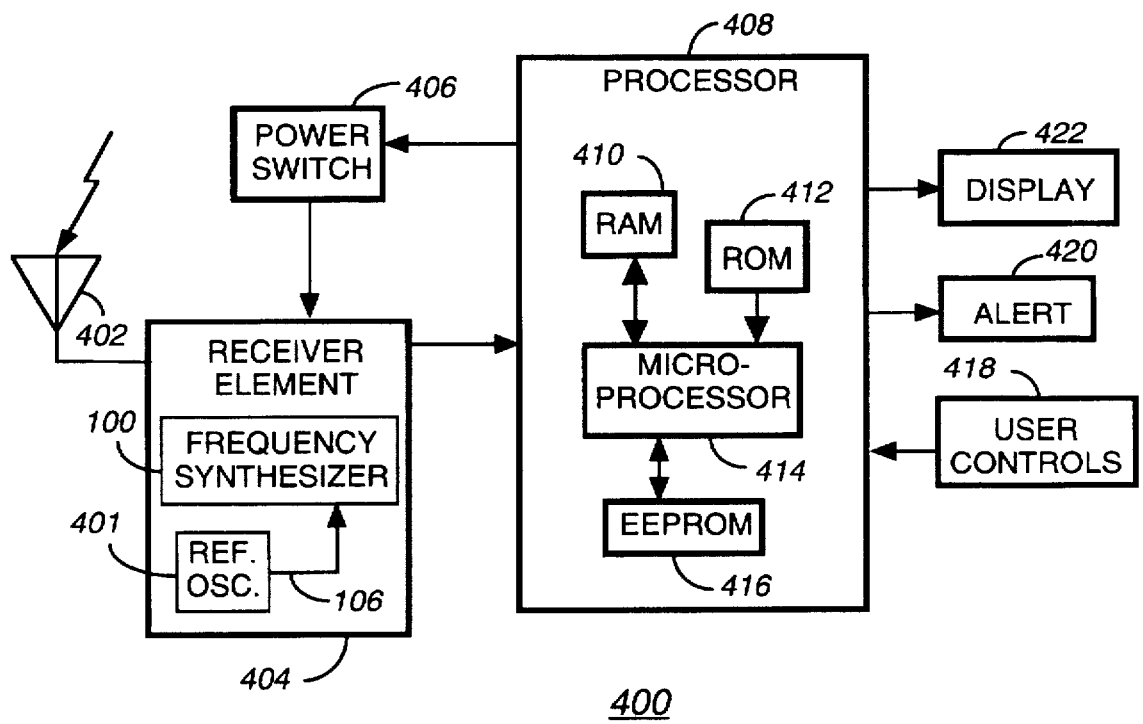
FIG. 4 is an electrical block diagram of a communication receiver in accordance with the preferred embodiment of the present invention.

FIG. 4 is an electrical block diagram of a communication receiver 400 in accordance with the preferred embodiment of the present invention. The communication receiver 400 includes an antenna 402 for intercepting a radio signal comprising messages from a transmitting station (not shown). The antenna 402 is coupled to a receiver element 404 for demodulating the RF signals. The receiver element 404 includes a reference oscillator 401 for generating the clock signal 106, and the frequency synthesizer 100 in accordance with the present invention for generating the proper operational signals utilized by the demodulation circuits of the receiver element 404. Once the RF signals have been demodulated, the receiver element 404 generates demodulated message information which is presented to a processor 408 for processing. A conventional power switch 406, coupled to the processor 408, is used to control the supply of power to the receiver element 404, thereby providing a battery saving function.

To perform the necessary functions of the communication receiver 400, the processor 408 includes a microprocessor 414, a random access memory (RAM) 410, a read-only memory (ROM) 412, and an electrically erasable programmable read-only memory (EEPROM) 416.

Preferably, the microprocessor 414 is similar to the M68HC08 micro-controller manufactured by Motorola, Inc. It will be appreciated that other similar processors can be utilized for the microprocessor 414, and that additional processors of the same or alternative type can be added as required to handle the processing requirements of the processor 408. It will also be appreciated that other types of memory, e.g., EEPROM or FLASH, can be utilized for the ROM 412, as well as the RAM 410. It will be further appreciated that the RAM 410 and the ROM 412, singly or in combination, can be manufactured as an integral portion of the microprocessor 414.

The processor 408 is programmed by way of the ROM 412 to process incoming messages transmitted by the transmitting station. During message processing, the processor 408 decodes in a conventional manner an address in the demodulated message information, compares the decoded address with one or more addresses stored in the EEPROM 416, and when a match is detected, the processor 408 proceeds to process the remaining portion of the message.

Once the processor 408 has processed the message, it stores the message in the RAM 410, and a call alerting signal is generated to alert a user that a message has been received. The call alerting signal is directed to a conventional audible or tactile alerting device 420 for generating an audible or tactile call alerting signal.

The message can be accessed by the user through user controls 418, which provide functions such as lock, unlock, delete, read, etc. More specifically, by the use of appropriate functions provided by the user controls 418, the message is recovered from the RAM 410, and then conveyed to the user by way of an information interface comprising a display 422 for displaying the message, e.g., a conventional liquid crystal display (LCD).

Thus, it should be apparent by now that the present invention provides a novel design for removing the spurious frequency of the reference signal 110 that would otherwise modulate noise on the controlled oscillator 122. This invention advantageously utilizes the tracking characteristics of integrated circuit fabrication processes to substantially reduce the effects of temperature and external component variations, thereby providing a circuit that can remove the spurious frequency of the reference signal 110 independent of fabrication and environmental variations. In particular, this invention utilizes a novel approach for locking the notch frequency of the main notch filter 118 to the reference signal 110 by way of the tracker PLL 128.

What is claimed is:

1. A frequency synthesizer for producing an output signal which is phase locked to a reference signal operating at a reference frequency, the frequency synthesizer comprising:

a main phase lock loop, including:
 a controlled oscillator for generating the output signal operating at an output frequency determined by a filtered control signal;
 a first frequency divider coupled to the controlled oscillator for frequency dividing the output signal to produce a comparison signal operating at the reference frequency;

a main phase error detector coupled to the first frequency divider and coupled to the reference signal for generating a control signal; and a main notch filter having a notch frequency and coupled to the main phase error detector for selectively removing from the control signal a spurious noise signal occurring at the reference frequency, to derive the filtered control signal; and a tracker phase lock loop, including:

a tracker oscillator comprising a tracker filter coupled to a tracker adjustment signal for generating a tracker signal operating at a tracker frequency determined in part by the tracker adjustment signal; and a tracker phase error detector coupled to the reference signal and coupled to the tracker oscillator for generating the tracker adjustment signal for adjusting the tracker oscillator to phase lock the tracker signal to the reference signal.

2. The frequency synthesizer of claim 1, wherein the main notch filter also is coupled to the tracker adjustment signal, and wherein the main notch filter is similar to the tracker filter but scaled such that the notch frequency of the main notch filter falls near the reference frequency in response to the tracker adjustment signal when the tracker signal is phase locked to the reference signal.

3. The frequency synthesizer of claim 2, wherein at least one of the main notch filter and the tracker filter is a transconductance-C elliptic low pass filter.

4. The frequency synthesizer of claim 3, wherein the main notch filter and the tracker filter comprise an operational transconductance amplifier (OTA) having a transconductance controlled by the tracker adjustment signal, and wherein the main notch filter and the tracker filter each have a cutoff frequency proportional to the transconductance.

5. The frequency synthesizer of claim 1, wherein the first frequency divider comprises a first programmable frequency divider.

6. The frequency synthesizer of claim 5, further comprising a second frequency divider coupled to a clock signal for generating the reference signal, the second frequency divider including a second programmable frequency divider.

7. A communication receiver, comprising:

an antenna for intercepting a radio signal including a message;

a receiver element coupled to the antenna for demodulating the message;

a processor coupled to the receiver element for processing the message;

a user control coupled to the processor for providing control of the communication receiver by a user; and a display coupled to the processor for displaying the message, wherein the receiver element includes:

a reference oscillator for generating a reference signal operating at a reference frequency; and a frequency synthesizer coupled to the reference oscillator for producing an output signal which is phase locked to the reference signal, the frequency synthesizer comprising:

a main phase lock loop, including:

a controlled oscillator for generating the output signal operating at an output frequency determined by a filtered control signal;

a first frequency divider coupled to the controlled oscillator for frequency dividing the output signal to produce a comparison signal operating at the reference frequency;

a main phase error detector coupled to the first frequency divider and coupled to the reference signal for generating a control signal; and a main notch filter having a notch frequency and coupled to the main phase error detector for selectively removing from the control signal a spurious noise signal occurring at the reference frequency, to derive the filtered control signal; and a tracker phase lock loop, including:

a tracker oscillator comprising a tracker filter coupled to a tracker adjustment signal for generating a tracker signal operating at a tracker frequency determined in part by the tracker adjustment signal; and a tracker phase error detector coupled to the reference signal and coupled to the tracker oscillator for generating the tracker adjustment signal for adjusting the tracker oscillator to phase lock the tracker signal to the reference signal.

8. The communication receiver of claim 7, wherein the main notch filter also is coupled to the tracker adjustment signal, and wherein the main notch filter is similar to the tracker filter but scaled such that the notch frequency of the main notch filter falls near the reference frequency in response to the tracker adjustment signal when the tracker signal is phase locked to the reference signal.

9. The communication receiver of claim 8, wherein at least one of the main notch filter and the tracker filter is a transconductance-C elliptic low pass filter.

10. The communication receiver of claim 9, wherein the main notch filter and the tracker filter comprise an operational transconductance amplifier (OTA) having a transconductance controlled by the tracker adjustment signal, and wherein the main notch filter and the tracker filter each have a cutoff frequency proportional to the transconductance.

11. The communication receiver of claim 7, wherein the first frequency divider comprises a first programmable frequency divider.

12. The communication receiver of claim 11, further comprising a second frequency divider coupled to a clock signal for generating the reference signal, the second frequency divider including a second programmable frequency divider.

13. A frequency synthesizer for producing an output signal which is phase locked to a reference signal operating at a reference frequency, the frequency synthesizer comprising:

a main phase lock loop, including:

a controlled oscillator for generating the output signal operating at an output frequency determined by a filtered control signal;

a first frequency divider coupled to the controlled oscillator for frequency dividing the output signal to produce a comparison signal operating at the reference frequency;

a main phase error detector coupled to the first frequency divider and coupled to the reference signal for generating a control signal; and a main filter coupled to the main phase error detector for filtering the main phase lock loop to derive the filtered control signal, wherein the frequency synthesizer further comprises:
a tracker phase lock loop, including:
- a tracker oscillator comprising a tracker filter coupled to a tracker adjustment signal for generating a tracker signal operating at a tracker frequency determined in part by the tracker adjustment signal; and
- a tracker phase error detector coupled to the reference signal and coupled to the tracker oscillator for generating the tracker adjustment signal for adjusting the tracker oscillator to phase lock the tracker signal to the reference signal; and wherein the main filter is similar to the tracker filter but selected characteristic frequencies of the main filter are scaled in proportion to the reference frequency in response to the tracker adjustment signal when the tracker signal is phase locked to the reference signal, wherein the main filter and the tracker filter comprise an operational transconductance amplifier (OTA) having a transconductance controlled by the tracker adjustment signal, and wherein the main filter and the tracker filter each have a cutoff frequency proportional to the transconductance.

14. The frequency synthesizer of claim 13, wherein at least one of the main filter and the tracker filter is a transconductance-C elliptic low pass filter.

* * * * *